(12) United States Patent
Kato et al.

(10) Patent No.: US 8,593,897 B2
(45) Date of Patent: Nov. 26, 2013

(54) MEMORY CONTROLLER, SEMICONDUCTOR STORAGE DEVICE, AND MEMORY SYSTEM INCLUDING THE MEMORY CONTROLLER AND THE SEMICONDUCTOR STORAGE DEVICE FOR OUTPUTTING TEMPERATURE VALUE IN LOW POWER CONSUMPTION MODE

(75) Inventors: Kunihiko Kato, Chuo-ku (JP); Toru Ishikawa, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 298 days.

(21) Appl. No.: 13/028,862

(22) Filed: Feb. 16, 2011

(65) Prior Publication Data
US 2011/0199851 A1 Aug. 18, 2011

(30) Foreign Application Priority Data
Feb. 17, 2010 (JP) .................. 2010-032451

(51) Int. Cl.
*G11C 7/04* (2006.01)
(52) U.S. Cl.
USPC .... 365/211; 365/189.17; 365/227; 365/233.1
(58) Field of Classification Search
USPC .................. 365/189.17, 221, 227, 233.1
See application file for complete search history.

(56) References Cited

U.S. PATENT DOCUMENTS

2007/0286004 A1* 12/2007 Kim et al. .................. 365/212

FOREIGN PATENT DOCUMENTS

| JP | 2005-235362 A | 9/2005 |
| JP | 2006-277892 A | 10/2006 |
| JP | 2007-080383 A | 3/2007 |
| JP | 2007-122807 A | 5/2007 |
| JP | 2007-225477 A | 9/2007 |
| JP | 2007-305288 A | 11/2007 |

* cited by examiner

*Primary Examiner* — Hoai V Ho
(74) *Attorney, Agent, or Firm* — Sughrue Mion, PLLC

(57) ABSTRACT

A memory system includes a clock generation circuit, a memory device, and a controller. The memory device includes output circuits and a temperature sensor, the output circuits configured to output data at an output timing obtained based on a clock signal supplied from the clock generation circuit. The controller includes input circuits that receive the data outputted from the memory device at an input timing obtained based on a clock signal supplied from the clock generation circuit and a correction value setting circuit that adjusts the input timing based on a temperature value from the temperature sensor.

11 Claims, 6 Drawing Sheets

| TEMPERATURE SENSOR VALUE | DELAY AMOUNT (ps) | | |
|---|---|---|---|
| | $DQ_0$ | ... | $DQ_{n-1}$ |
| 000 | 50 | ... | 40 |
| 001 | 60 | ... | 50 |
| 010 | 65 | ... | 57 |
| 011 | 70 | ... | 60 |
| 100 | 73 | ... | 63 |
| 101 | 76 | ... | 66 |
| 010 | 77 | ... | 67 |
| 111 | 79 | ... | 69 |

MEMORY CONTROLLER, SEMICONDUCTOR STORAGE DEVICE, AND MEMORY SYSTEM INCLUDING THE MEMORY CONTROLLER AND THE SEMICONDUCTOR STORAGE DEVICE FOR OUTPUTTING TEMPERATURE VALUE IN LOW POWER CONSUMPTION MODE

BACKGROUND OF THE INVENTION (1) Field of the Invention

The present invention relates to a controller that controls memory represented by a DRAM (Dynamic Random Access Memory) and a memory system including the controller, and particularly, a controller including a synchronization circuit and a memory system including the controller.

(2) Description of Related Art

In recent high-speed memories, data is inputted and outputted in synchronization with a high-frequency clock. In particular, in a memory such as XDR DRAM (Extreme Data Rate Dynamic Random Access Memory) which is an ultra-fast memory, a plurality of bits (for example, 8 bits or 16 bits) of data are outputted in one clock. Such a memory includes bit-by-bit output terminals, and input timing based on the clock is adjusted bit by bit to control the timing gap between the data outputted from the output terminals, i.e. between bits (between DQs).

FIG. 1 shows a semiconductor storage device in which such an adjustment of input timing is performed. The semiconductor storage device comprises memory device 100, controller 200, and clock generation circuit 300.

Memory device 100 comprises output circuits $101_1$ to $101_n$ that output data $DQ_0$ to $DQ_{n-1}$ read out from a memory array based on a synchronization signal supplied from clock generation circuit 300 and synchronization circuit 102 that is a PLL (Phase-locked Loop) circuit and that generates a synchronization signal based on a clock from clock generation circuit 300.

Controller 200 comprises input circuits $201_1$ to $201_n$ corresponding to data $DQ_0$ to $DQ_{n-1}$ read out from memory device 100, delay compensation circuits $202_1$ to $202_n$ corresponding to input circuits $201_1$ to $201_n$, and synchronization circuit 203. Synchronization circuit 203 is a PLL circuit and generates a synchronization signal based on the clock from clock generation circuit 300. The synchronization signal from synchronization circuit 203 is supplied to input circuits $201_1$ to $201_n$ through delay compensation circuits $202_1$ to $202_n$. Input circuits $201_1$ to $201_n$ correspond one to one with output circuits $101_1$ to $101_n$, and input circuits $201_1$ to $201_n$ import data from corresponding output circuits in response to the synchronization signal from synchronization circuit 203. At this point, delay compensation circuits $202_1$ to $202_n$ adjusts data import timing, by input circuits $201_1$ to $201_n$, of the synchronization signal from synchronization circuit 203 based on set correction values.

Although the data import timing is adjusted this way, the temperature of memory device 100 sequentially changes depending on the frequency of access to memory device 100 or depending on the use environment if a high-frequency clock is used, and the amount of timing gap due to the device characteristic change based on the temperature change also changes. Therefore, in general, the correction values set to the delay compensation circuits are periodically (for example, 10 ms intervals) adjusted to follow the temperature change.

For example, controller 200 controls writing of specific data to memory device 100 and then outputs the specific data from memory device 100. Controller 200 searches the timing of input of an expected value for each DQ and adjusts the correction values of the delay compensation circuits based on the result.

Related art of the semiconductor storage device is described in JP2005-235362A, JP2006-277892A, JP2007-080383A, JP2007-122807A, JP2007-225477A, and JP2007-305288A.

However, the present inventor has found out that the semiconductor storage device, in which the correction values associated with the input and output operations of data are periodically adjusted, has the following problems.

In general, a normal operation mode, in which a memory controller inputs and outputs data, as well as a power down mode (low power consumption mode) for reducing the power consumption can be set in a memory such as XDR DRAM.

However, since the memory controller periodically adjusts the correction values associated with the input and output operations of data, the correction values are also adjusted when the power down mode is set. The following operation is required in the adjustment of the correction values in the power down mode setting period. The mode is switched back from the power down mode to the normal operation mode, the memory controller imports the output from $DQ_0$ to $DQ_{n-1}$ of the memory to adjust the correction values, and then the memory is shifted again to the power down mode.

Therefore, the normal operation mode needs to be restored even though the memory is in the power down mode setting period. There is a problem in which the power consumption increases so that the effect of the power consumption reduction by the power down mode cannot be efficiently obtained.

The following problem occurs if the correction values are not adjusted in the power down mode setting period.

Usually, the temperature of the memory gradually decreases when the mode shifts from the normal operation mode to the power down mode. Therefore, the temperature of the memory at the time of the restoration of the normal operation mode from the power down mode is low enough, compared to the temperature of the memory when the correction values are adjusted immediately preceding the shift from the normal operation mode to the power down mode. When the difference between the temperature of the memory at the time of the restoration of the normal operation mode and the temperature of the memory at the last adjustment of the correction values is large, the point where the expected value appears in the window is far off the center of the window. As a result, much time is required to adjust (search) the correction values.

In this way, if the correction values are not adjusted in the power down mode setting period, there is a problem in which much time is required to detect optimal correction values by searching DQs upon the restoration of the normal operation mode from the power down mode. Therefore, the correction values also need to be adjusted in the power down setting period.

SUMMARY

In one embodiment, there is provided a memory system that includes:

a clock generation circuit that generates a clock signal;

a memory device that includes an output circuit and a temperature sensor, the output circuit being configured to output data at an output timing which is obtained based on the clock signal which is supplied from the clock generation circuit and the temperature sensor being configured to detect a temperature of the memory device; and a controller that includes an input circuit and a correction value setting circuit, the input circuit being configured to receive the data which is output from the memory device at an input timing which is obtained based on the clock signal which is supplied from the clock generation circuit and the correction value setting circuit being configured to adjust the input timing based on a temperature value of the memory device which is supplied from the temperature sensor.

In another embodiment, there is provided a semiconductor storage device that includes:

a synchronization circuit that generates a synchronization signal that is in synchronization with an input clock signal;

a plurality of output circuits that are activated in a normal operation mode to output data that has been requested based on the synchronization signal and that are deactivated in a low power consumption mode;

a temperature sensor the detects a temperature of the semiconductor storage device; and another output circuit capable of outputting a temperature value which is supplied from the temperature sensor in the low power consumption mode.

In another embodiment, there is provided a memory controller that includes:

a synchronization circuit that generates a synchronization signal that is in synchronization with an inputted clock;

a delay compensation circuit that compensates a delay value of the synchronization signal based on a correction value to output the compensated synchronization signal;

a plurality of input circuits that imports data which have been requested based on the compensated synchronization signal in a normal operation mode; and a correction value setting circuit that sets the correction value based on a temperature value which is imported from the outside in at least a low power consumption mode.

According to the memory system, the semiconductor storage device, and the memory controller, the temperature value can be read out from the memory in the setting period of the low power consumption mode without shifting the memory to the normal operation mode, and the input timing can be corrected in accordance with the read temperature.

Furthermore, the delay amount corresponding to the temperature of the memory can be determined with reference to the table without initiating detection of the optimal correction values by searching DQs. Therefore, the delay amount can be determined in a short time upon restoration of the normal operation mode without the correction of the input timing in the setting period of the low power consumption mode.

In this way, the input timing can be corrected in accordance with the temperature read out from the memory in the setting period of the low power consumption mode without shifting the memory to the normal operation mode. Therefore, the correction values can be set in accordance with the temperature change in the memory while maintaining the reduced power consumption.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

Figure 2:
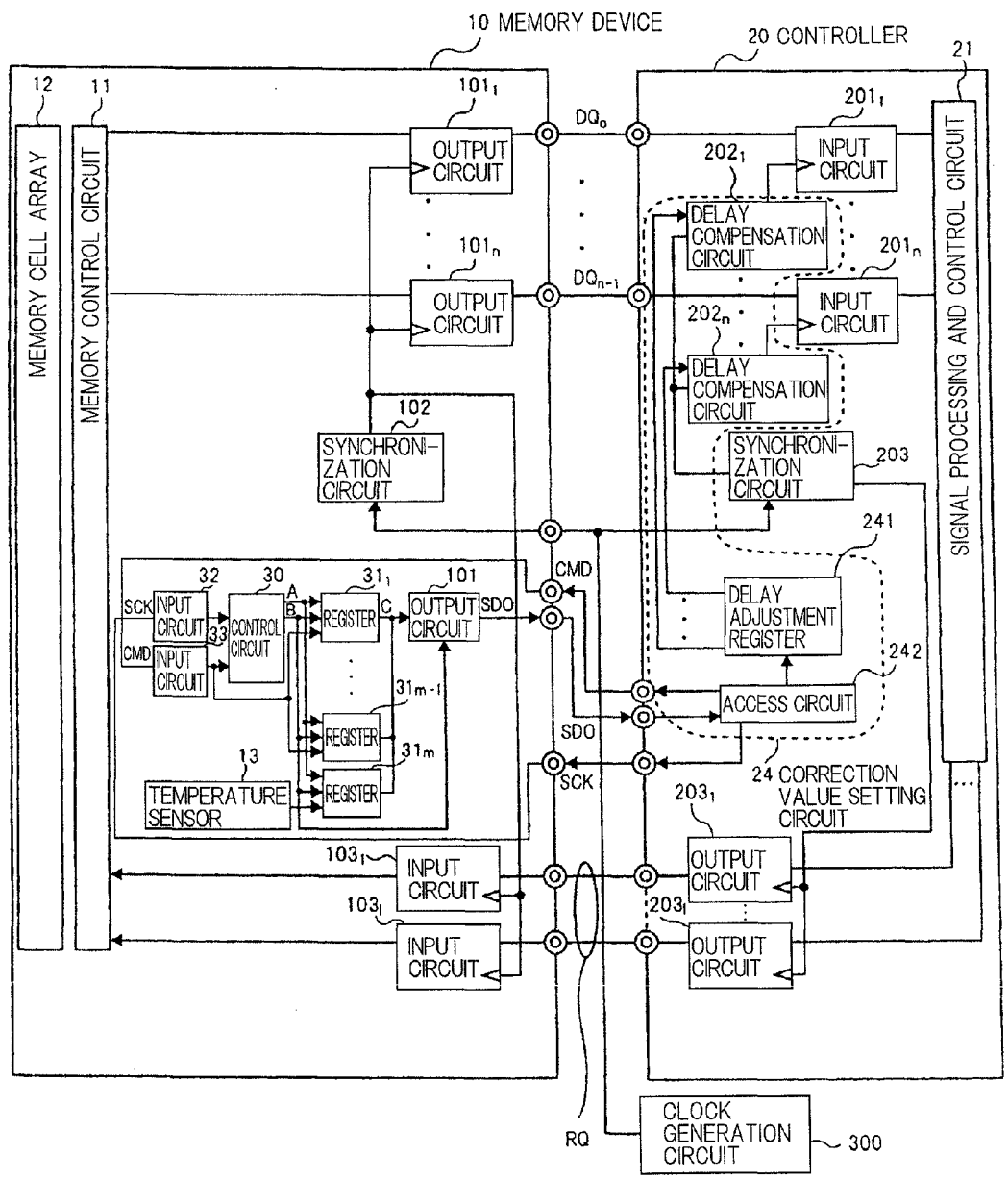
FIG. 2 is a block diagram showing a memory system as a first exemplary embodiment.

FIG. 2 is a block diagram showing a memory system as a first exemplary embodiment.

The memory system according to the first exemplary embodiment comprises memory device 10 as a semiconductor storage device, controller 20, and clock generation circuit 300.

Figure 1:
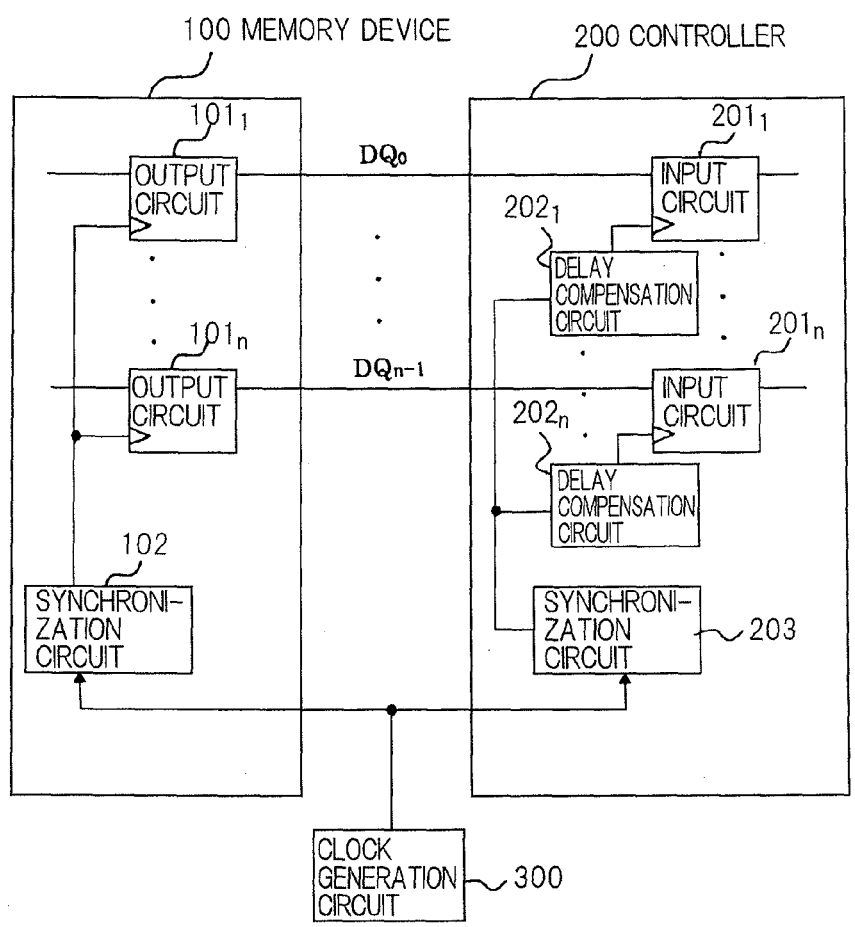
FIG. 1 is a block diagram showing a semiconductor storage device as related art.

Memory device 10 is a semiconductor storage device in which temperature sensor 13 is further installed in conventional memory device 100 shown in FIG. 1. In controller 20, correction value setting means 24 is further installed in conventional controller 200 shown in FIG. 1. In FIG. 2, the same configurations as the configurations shown in FIG. 1 are designated with the same reference numerals.

Temperature sensor 13 arranged in memory device 10 detects the temperature (internal temperature) of memory device 10, and correction value setting means 24 receives an output value (temperature of memory device 10) based on the detected temperature. Correction value setting means 24 sets correction values to delay compensation circuits $202_1$ to $202_n$ as delay means and comprises delay adjustment register 241 and access circuit 242.

Access circuit 242 periodically outputs a command (command for reading out an output value of the temperature sensor) to access memory device 10 and acquires the output value of temperature sensor 13 (temperature value of memory). Access circuit 242 supplies the acquired temperature value to delay adjustment register 241.

Once the command for reading out the output value of the temperature sensor is received, memory device 10 uses terminals different from terminals connected to output circuits $101_1$ to $101_n$ to output the output value of temperature sensor 13 to controller 20 without using output circuits $101_1$ to $101_n$ used in normal operation. More specifically, the output value of the temperature sensor is transmitted from memory device 10 to controller 20 through paths different from the paths for data read out through output circuits $101_1$ to $101_n$ by a Read command that is a command for accessing the memory supplied in the normal operation mode.

Delay adjustment register 241 forms an input timing adjustment table storing delay amounts of input timing of data $DQ_0$ to $DQ_{n-1}$ for each temperature value detected by temperature sensor 13.

Figures 3, 4:
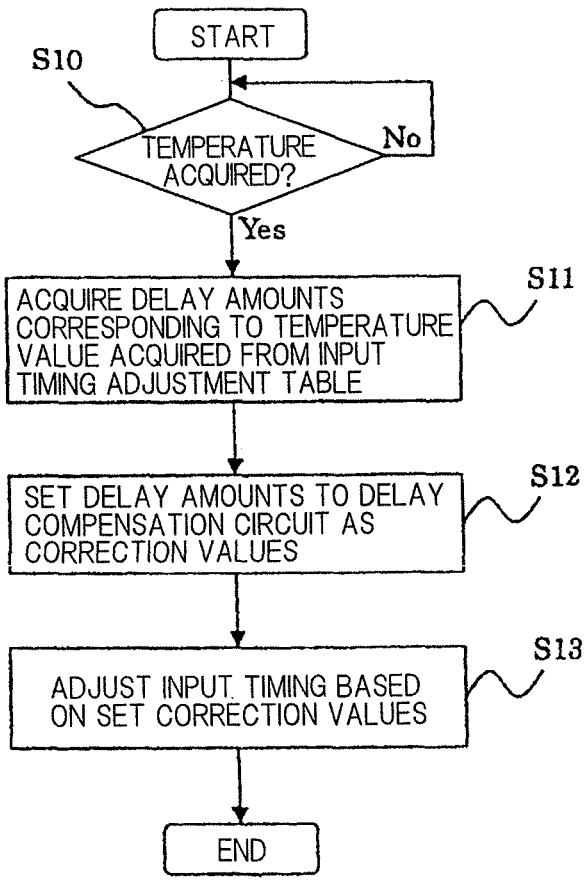
FIG. 3 is a schematic diagram showing an example of an input timing adjustment table.
FIG. 4 is a flow chart showing a procedure of an input timing correction process in the memory system shown in FIG. 2.

FIG. 3 shows an example of the input timing adjustment table. The output values of temperature sensor 13 are indicated by 3-bit digital signals in the input timing adjustment table, and the delay amounts of input timing of data $DQ_0$ to $DQ_{n-1}$ are stored for each output value. The unit of the delay amounts herein is picoseconds (ps).

When the temperature value of memory device 10 detected by temperature sensor 13 is supplied from access circuit 242 to delay adjustment register 241, delay adjustment register 241 acquires, for data $DQ_0$ to $DQ_{n-1}$, the delay amounts corresponding to the temperature value from the input timing adjustment table and sets the acquired delay amounts as correction values to corresponding delay compensation circuits among delay compensation circuits $202_1$ to $202_n$.

Delay compensation circuits $202_1$ to $202_n$ adjust the input timing of the synchronization signal from synchronization circuit 203 to input circuits $201_1$ to $201_n$ based on the correction values set by delay adjustment register 241.

FIG. 4 shows a procedure of an input timing correction process in the memory system of the exemplary embodiment.

Whether access circuit 242 has acquired the temperature value of memory device 10 from temperature sensor 13 based on the command for reading out the output value of the temperature sensor outputted to memory device 10 is determined (step S10).

Delay adjustment register 241 is accessed based on the temperature value acquired by access circuit 242, and the delay amounts corresponding to the temperature value are acquired for data $DQ_0$ to $DQ_{n-1}$ from the input timing adjustment table (step S11).

The delay amounts acquired for data $DQ_0$ to $DQ_{n-1}$ obtained from delay adjustment register 241 are outputted and set as correction values to corresponding delay compensation circuits among delay compensation circuits $202_1$ to $202_n$ (step S12).

Lastly, delay compensation circuits $202_1$ to $202_n$ adjust the input timing based on the correction values set by delay adjustment register 241 (step S13).

In the exemplary embodiment, the input timing correction process is periodically (for example, 10 ms intervals) carried out regardless of the operation mode.

According to the memory system of the exemplary embodiment, when the command (instruction signal) for acquiring the output value of temperature sensor 13 is received from access circuit 242, memory device 10 uses terminals different from the terminals that are connected to output circuits $101_1$ to $101_n$ to output the output value of temperature sensor 13 to controller 20 without using output circuits $101_1$ to $101_n$ used in the normal operation mode. More specifically, the output value of the temperature sensor is transmitted from memory device 10 to controller 20 through paths difference from the paths for data read out through output circuits $101_1$ to $101_n$ based on a Read command that is a command for accessing the memory supplied in the normal operation mode.

Therefore, for example, the temperature value of memory device 10 can be acquired in the power down mode setting period without the shift from the power down mode to another mode (such as normal operation mode), and the input timing correction process shown in FIG. 4 can be carried out.

Although a configuration, in which a dedicated output terminal is arranged on memory device 10 as an output terminal of temperature sensor 13, can be considered as a configuration that allows access circuit 242 to acquire the output value of temperature sensor 13 from memory device 10 without other operations by memory device 10, a serial output terminal (SDO) arranged in advance in memory device 10, such as XDR-DRAM described below, can be shared as the output terminal of temperature sensor 13.

The XDR-DRAM comprises registers to control operations, and signals, such as command signal CMD, serial data input SDI, serial data output SDO, and serial clock SCK, are used to access the registers. Access to normal memory is performed through request signal RQ including read/write and address arranged separately from the signals and through data DQ.

As shown in FIG. 2, memory device 10 further comprises memory control circuit 11, memory cell array 12, control circuit 30, registers $31_1$ to $31_m$ in which various parameters upon activation are set, input circuits $103_1$ to $103_l$, 32, and 33, and output circuit 101. Controller 20 further comprises signal processing and control circuit 21 and output circuits $203_1$ to $203_l$.

Input circuits $103_1$ to $103_l$ of memory device 10 and output circuits $203_1$ to $203_l$ of controller 20 are connected one to one. Controller 20 transmits request signal RQ in the normal memory access to memory device 10 through input circuits $103_1$ to $103_l$ and output circuits $203_1$ to $203_l$. The output of input circuits $103_1$ to $103_l$ is supplied to memory control circuit 11. Memory control circuit 11 accesses (reads or writes) memory cell array 12 based on request signal RQ. Memory control circuit 11 also outputs data read out from memory cell array 12 to output circuits $101_1$ to $101_n$. Data DQ outputted from output circuits $101_1$ to $101_n$ is supplied to signal processing and control circuit 21 through input circuits $201_1$ to $201_n$.

In memory device 10, command signal CMD is supplied from controller 20 to input circuit 32, and serial clock signal SCK is supplied from controller 20 to input circuit 33. The output of input circuit 32 is supplied to control circuit 30. The output of input circuit 33 is supplied to control circuit 30 and also to registers $31_1$ to $31_{m-1}$.

Registers $31_1$ to $31_m$ for controlling the operations comprise flip-flops connected in series, and the output is supplied to output circuit 101 as signal C.

When controller 20 accesses registers $31_1$ to $31_m$, serial clock signal SCK and command signal CMD are supplied from controller 20 to control circuit 30. Supplied command signal CMD includes a transaction (data indicating one of write and read), a device ID (data indicating which DRAM to access), and a register address (data indicating which register to access). If command signal CMD indicates write, write data is serially supplied to control circuit 30 as serial input signal SDI.

After receiving command signal CMD, control circuit 30 determines the transaction and the device ID, generates a register address signal (serial/parallel conversion), generates a timing control signal and an output enable signal, supplies the register address signal, the timing control signal, etc. to registers $31_1$ to $31_m$ as signal A, and supplies the output enable signal to registers $31_1$ to $31_m$ as signal B. The register address signal is a signal for designating one of registers $31_1$ to $31_m$.

The register designated by the register address signal holds the write data supplied as part of command signal CMD when command signal CMD indicates write based on the timing control signal and supplies the held data to output circuit 101 as signal C based on signal B (output enable signal) when command signal CMD indicates read. After receiving the data, output circuit 101 supplies the data to access circuit 242 in response to the output enable signal.

Therefore, to read out the temperature value held in register $31_m$, access circuit 242 outputs, to memory device 10, command signal CMD of read including the register address indicating register $31_m$, and control circuit 30 that has received command signal CMD supplies the temperature value held in register $31_m$ to output circuit 101. Output circuit 101 outputs the temperature value to access circuit 242 in response to output enable signal B. Although the temperature value is written in advance in register $31_m$ in the description herein, it is obvious that a circuit such as a timer (not shown) for periodically writing the temperature value in memory device 10 is required to write the temperature value in advance. However, control circuit 30 may write the temperature value of temperature sensor 13 in register $31_m$ when the command signal is inputted, and then the data of register $31_m$ may be supplied to output circuit 101.

According to the configuration, the use of the serial output terminal for parameters as the terminal for outputting the temperature value can reduce the manufacturing cost, compared to a configuration in which the dedicated terminal is arranged as the terminal for outputting the temperature value. Any of output circuit $101_1$ to $101_n$ shown in FIG. 2 can be shared as long as the output circuit 101 is controlled not to be deactivated in the low power consumption mode.

According to the memory system of the exemplary embodiment, the input timing can be corrected according to the temperature of memory device 10 without performing input and output operations of data to and from memory device 10, even if memory device 10 is in the low power consumption mode. The input timing can be corrected according to the temperature of memory device 10 in the setting period of the low power consumption mode (power down mode) without shifting from the low power consumption mode to another mode (such as normal operation mode) even if the input timing is periodically corrected. Therefore, the effect of power consumption reduction in the low power consumption mode can be sufficiently obtained.

The delay amounts corresponding to the temperature of memory device 10 can be determined with reference to the input timing adjustment table without detecting the optimal correction values by searching DQs. Therefore, the delay amounts can be determined in a short time upon the restoration of the normal operation mode even if the input timing is not corrected in the setting period of the low power consumption mode.

In the memory system of the exemplary embodiment, the input timing correction process may be periodically executed only in the period in which the input and output operations of data are performed. The input timing correction process may also be periodically executed in the period other than the power down mode setting period.

Second Exemplary Embodiment

Figure 5:
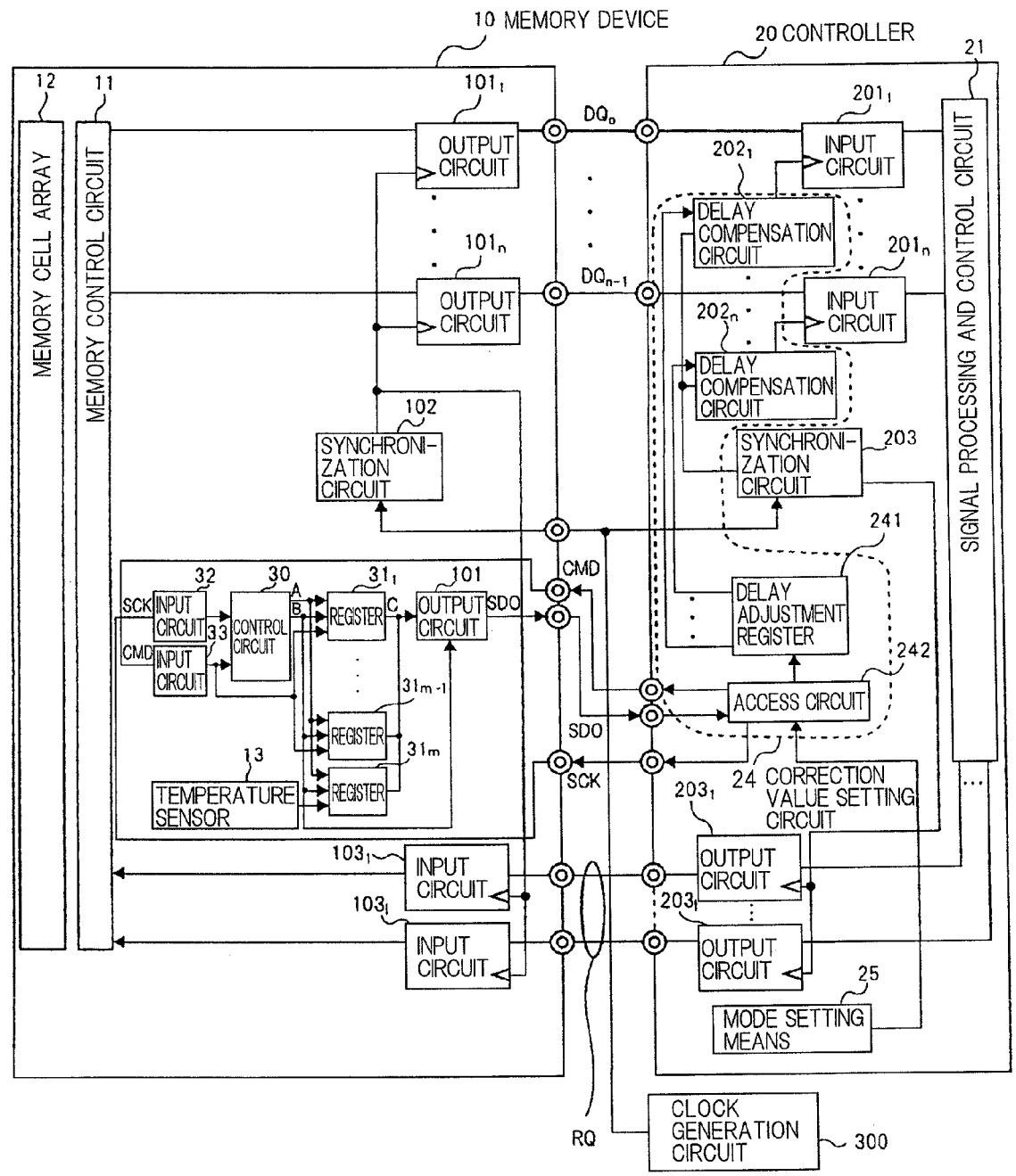
FIG. 5 is a block diagram showing a configuration of a memory system as a second exemplary embodiment.

FIG. 5 is a block diagram showing a configuration of a memory system as a second exemplary embodiment.

In the memory system of the exemplary embodiment, mode setting means 25 is further installed in the configuration of the first exemplary embodiment, and part of the adjustment operation of the correction values is different from that in the first exemplary embodiment.

Mode setting means 25 is configured to set the operation mode of memory device 10. The normal operation mode and the power down mode can be set as the operation mode by mode setting means 25. Writing operations of data to memory device 10 and reading operations of data from memory device 10 (output operations of data by output circuits $101_1$ to $101_n$) are performed in the normal operation mode. The input and output operations of data of memory device 10 are not performed in the power down mode. Command signal CMD, etc. shown in FIG. 2 are used to set the mode.

If a change in the mode is requested based on a signal from a timer that is not shown or from outside the controller, mode setting means 25 supplies access circuit 242 with a set mode signal indicating the set mode.

Access circuit 242 to which the set mode signal is supplied from mode setting means 25 can recognize the restoration of the normal operation mode from the power down mode. Therefore, access circuit 242 outputs command signal CMD to memory device 10 to acquire the temperature value of memory device 10 from temperature sensor 13 upon restoration of the normal operation mode from the power down mode.

As in the first exemplary embodiment, access circuit 242 acquires the temperature value from memory device 10 based on command signal CMD. Based on the acquired temperature value, the delay amounts corresponding to the temperature value are acquired for data $DQ_0$ to $DQ_{n-1}$ from the input timing adjustment table formed by the delay adjustment register. The delay amounts acquired for data $DQ_0$ to $DQ_{n-1}$ are set to corresponding delay compensation circuits among delay compensation circuits $202_1$ to $202_n$ as correction values, and delay compensation circuits $202_1$ to $202_n$ adjust the input timing based on the correction values set by delay adjustment register 241. After completion of the adjustment, command signal CMD is used to instruct memory device 10 to shift to the normal operation mode. Controller 20 accesses memory device 10 after memory device 10 returns to the normal operation mode.

According to the memory system of the exemplary embodiment, the temperature value of the memory is read out to adjust the correction values upon restoration of the normal operation mode from the power down mode. Therefore, the timing gap immediately after restoration of the normal operation mode can also be prevented.

Third Exemplary Embodiment

Although the configuration of a memory system as a third exemplary embodiment is the same as that of the second exemplary embodiment, part of the adjustment operation of the correction values is different.

Mode setting means 25 supplies a set mode signal to access circuit 242 once the mode is set and supplies an initialization signal indicative of the initialization to access circuit 242 upon initialization.

Access circuit 242 determines whether the period is the power down mode setting period based on the set mode signal and supplies the mode period determination result to delay adjustment register 241. When the initialization signal is received, access circuit 242 acquires the temperature value of memory device 10 from temperature sensor 13.

The output of output circuits $101_1$ to $101_n$ and the output of compensation circuits $202_1$ to $202_n$ are also supplied to delay adjustment register 241.

When the initialization signal (resent signal) is received from access circuit 242, delay adjustment register 241 executes the adjustment process of the correction values using the input timing adjustment table. Delay adjustment register 241 also executes the adjustment process of the correction values associated with the data input and output operations in the period other than the power down mode setting period based on the mode period determination result from access circuit 242.

Figure 6:
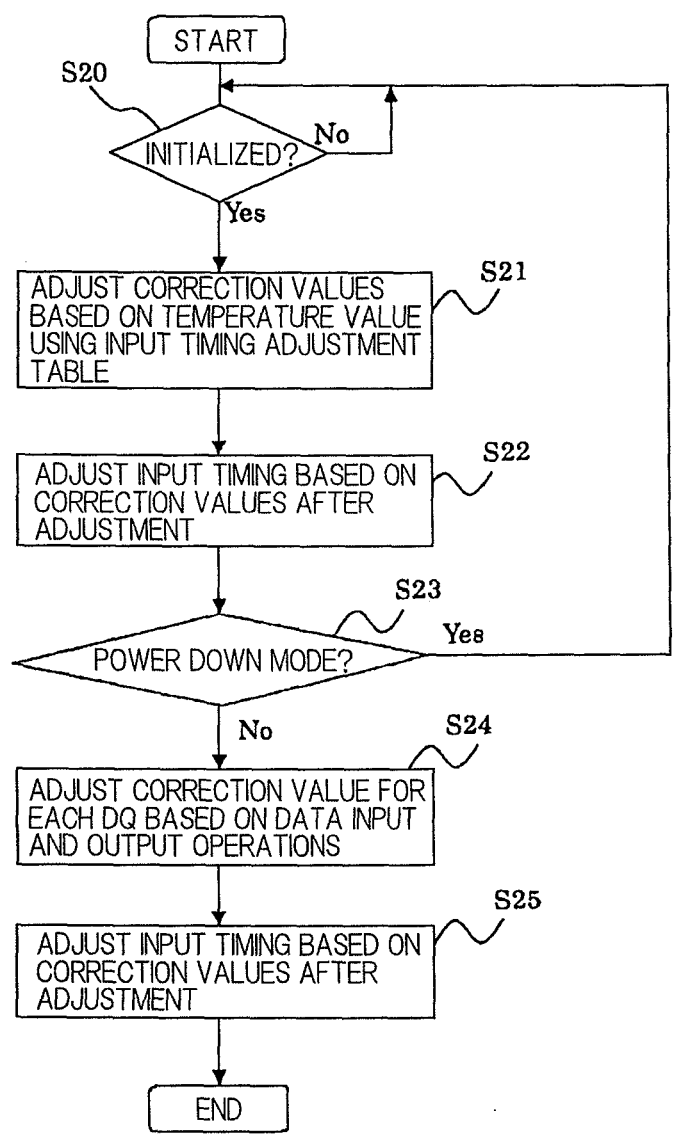
FIG. 6 is a flow chart showing a procedure of an input timing correction process in the memory system shown in FIG. 5.

FIG. 6 shows a procedure of an input timing correction process in the memory system of the exemplary embodiment.

Access circuit 242 first determines whether the initialization signal (reset signal) is received from mode setting means 25 (step S20).

If the initialization signal is received, access circuit 242 acquires the temperature value of memory device 10 from temperature sensor 13. When the temperature value is acquired by access circuit 242, delay adjustment register 241 acquires, for data $DQ_0$ to $DQ_{n-1}$, the delay amounts corresponding to the temperature value from the input timing adjustment table. Delay adjustment register 241 sets the delay amounts acquired for data $DQ_0$ to $DQ_{n-1}$ to corresponding delay compensation circuits among delay compensation circuits $202_1$ to $202_n$ as the correction values (step S22).

After the correction values are set, delay compensation circuits $202_1$ to $202_n$ adjust the input timing based on the correction values set by delay adjustment register 241 (step S23).

After the input timing adjustment by initialization, access circuit 242 determines whether the period is the power down mode setting period based on the set mode signal from mode setting means 25 and supplies the mode period determination result to delay adjustment register 241 (step S23).

Delay adjustment register 241 adjusts the correction values based on the data input and output operations in the period other than the power down mode setting period. In the adjustment of the correction values, the process described in BACKGROUND OF THE INVENTION is carried out (step S24). Specifically, delay adjustment register 241 writes specific data in memory device 10 through access circuit 242 and then outputs the specific data from memory device 10. Delay adjustment register 241 compares the output signals of output circuits $101_1$ to $101_n$ and output signals of delay compensation circuits $202_1$ to $202_n$ to search for the timing of the input of the expected value for each DQ, and then delay adjustment register 241 determines optimal values of the correction values of delay compensation circuits $202_1$ to $202_n$ based on the result.

After the optimal values of the correction values are determined, delay compensation circuits $202_1$ to $202_n$ adjust the input timing based on the optimal values determined by delay adjustment register 241 (step S25).

The adjustment process of the correction values by delay adjustment register 241 is not executed in the power down mode setting period.

Mode setting means 25 may supply the reset signal to access circuit 242 upon restoration of the normal operation mode from the power down mode in the input timing adjustment process. The process of steps S21 and S22 may be executed in the power down mode setting period.

According to the memory system of the exemplary embodiment, the correction values are periodically adjusted in association with the data input and output operations in the period other than the power down mode setting period. The optimal values of the correction values can be more accurately determined in the adjustment of the correction values in association with the data input and output operations, compared to the adjustment of the correction values using the input timing adjustment table.

Fourth Exemplary Embodiment

Although the configuration of a memory system as a fourth exemplary embodiment is the same as that of the second exemplary embodiment, part of the adjustment operation of the correction values is different.

Mode setting means 25 supplies the initialization signal (reset signal) indicating the initialization to access circuit 242 upon the initialization (reset).

When the initialization signal is received, access circuit 242 notifies delay adjustment register 241 that the signal has been received.

The output of output circuits $101_1$ to $101_n$ and the output of compensation circuits $202_1$ to $202_n$ are also supplied to delay adjustment register 241. When the reception of the initialization signal (reset signal) is notified from access circuit 242, delay adjustment register 241 executes a table creation process for creating the input timing adjustment table.

Figure 7:
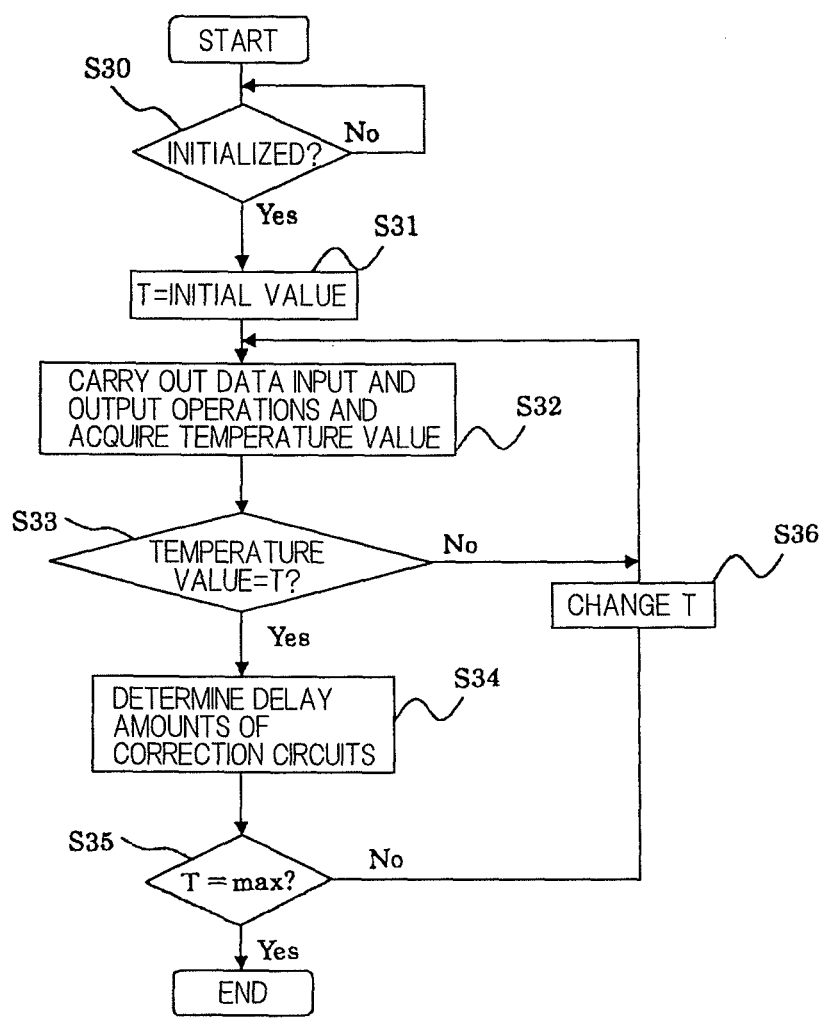
FIG. 7 is a flow chart showing a procedure of a table creation process of creating an input timing adjustment table.

FIG. 7 shows a procedure of the table creation process.

As shown in FIG. 7, access circuit 242 first determines whether the initialization signal (reset signal) is received from mode setting means 25 (step S30). When the initialization signal (reset signal) is received, access circuit 242 notifies delay adjustment register 241 that the signal has been received.

Delay adjustment register 241 sets temperature setting value T to the initial value (step S31). The initial value is "001" in the example shown in FIG. 3.

When the notification of the reception of the initialization signal is received from access circuit 242, delay adjustment register 241 causes access circuit 242 to write specific data in memory device 10, execute a process of outputting the specific data from memory device 10, and acquire the output values of temperature sensor 13 (step S32).

Delay adjustment register 241 compares the temperature value acquired in access circuit 242 with temperature setting value T and determines whether the values match (step S33). If the acquired values coincide with the setting value, delay adjustment register 241 compares the output signals of output circuits $101_1$ to $101_n$ with the output signals of delay compensation circuits $202_1$ to $202_n$, searches the timing of the input of the expected value for each DQ, and based on the result, determines the optimal values of the correction values of delay compensation circuits $202_1$ to $202_n$. At this point, delay adjustment register 241 also adjusts the timing on the write side of memory device 10 (at which timing the writing can be performed to read out the expected value, for each DQ). Delay adjustment register 241 associates and stores the determined optimal values (delay amounts) and the temperature acquisition values in the table (step S34).

Delay adjustment register 241 determines whether temperature setting value T is the maximum value. The maximum value is "111" in the example shown in FIG. 3. If temperature setting value T is the maximum value, the table creation process ends. If temperature setting value T is not the maximum value, delay adjustment register 241 changes temperature setting value T to the next setting value. The process of steps S32 to S35 is then executed.

As a result of the process, the input timing adjustment table as shown in FIG. 3 is created. After the creation of the input timing adjustment table, any of the adjustment processes of the correction values described in the first to third exemplary embodiments can be carried out.

In general, the correction values of delay compensation circuits include manufacturing variations of semiconductor storage devices. According to the memory system of the exemplary embodiment, the input timing adjustment table is created in each semiconductor storage device upon initialization. Therefore, the correction values of the delay compensation circuits can be set more accurately.

In the first to fourth exemplary embodiments, the process of steps S31 to S36 of FIG. 7 may be executed in the period other than the setting period of the power down mode (low power consumption mode), and the input timing adjustment table may be updated based on the result.

It is apparent that the present invention is not limited to the above embodiments, but may be modified and changed without departing from the scope and spirit of the invention.

What is claimed is:
1. A semiconductor storage device comprising:
a synchronization circuit that generates a synchronization signal that is in synchronization with an input clock signal;

a plurality of output circuits that are activated in a normal operation mode to output data that has been requested based on the synchronization signal and that are deactivated in a low power consumption mode;

a temperature sensor that detects a temperature of the semiconductor storage device; and another output circuit capable of outputting a temperature value which is supplied from the temperature sensor in the low power consumption mode.

2. The semiconductor storage device according to claim 1, wherein the other output circuit outputs the temperature value to the outside based on a command signal which is supplied from the outside in the low power consumption mode.

3. The semiconductor storage device according to claim 2, further comprising:

a control circuit that makes the other output circuit output the temperature value, which is supplied from the temperature sensor, to the outside based on a command signal which is supplied from the outside in the low power consumption mode.

4. The semiconductor storage device according to claim 1, further comprising:

a control circuit that writes the temperature value from the temperature sensor in a register based on a command signal which is supplied from the outside and that makes the other output circuit output the temperature value which is written in the register to the outside.

5. A semiconductor device comprising:

a first output circuit coupled to a first output terminal, the first output circuit being activated in a normal operation mode and being deactivated in a low power consumption mode;

a temperature sensor that detects a temperature thereof; and a second output circuit coupled to a second output terminal, the second output circuit outputting a value based on the temperature, irrespective of the low power consumption mode.

6. The semiconductor device according to claim 5, further comprising:

a command input terminal that receives a command signal, and the second output circuit outputting the temperature based on the command signal.

7. The semiconductor device according to claim 5, further comprising:

a first clock input terminal that receives a first clock signal, and the second output circuit outputting the temperature based on the first clock signal.

8. The semiconductor device according to claim 5, further comprising:

a second input terminal that receives a second clock signal.

9. The semiconductor device according to claim 8, further comprising:

a synchronization circuit that generates a synchronization signal based on the second clock signal, and supplying the synchronization signal to the first output circuit.

10. The semiconductor device according to claim 5, further comprising:

a register that stores a value of the temperature, and the second output circuit outputting the value stored in the register to the second output terminal.

11. The semiconductor device according to claim 5, further comprising:

wherein the second output circuit outputs the value of the temperature as a serial data to the second output terminal.

* * * * *